United States Patent
Zhuang et al.

(10) Patent No.: US 6,537,361 B2
(45) Date of Patent: Mar. 25, 2003

(54) METHOD OF THE SYNTHESIS AND CONTROL OF PGO SPIN-COATING PRECURSOR SOLUTIONS

(75) Inventors: Wei-Wei Zhuang, Vancouver, WA (US); Fengyan Zhang, Vancouver, WA (US); Jer-Shen Maa, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 145 days.

(21) Appl. No.: 09/822,637

(22) Filed: Mar. 30, 2001

(65) Prior Publication Data

US 2002/0139955 A1 Oct. 3, 2002

(51) Int. Cl.⁷ .............................. H01L 21/22; H01G 4/10
(52) U.S. Cl. ....................................... 106/287.19; 438/3
(58) Field of Search ........................... 106/287.19; 438/3

(56) References Cited

U.S. PATENT DOCUMENTS 3,754,975 A * 8/1973 Spiller ........................ 427/477
6,372,034 B1 * 4/2002 Zhuang et al. ......... 106/287.19

OTHER PUBLICATIONS

Article by C. J. Kim, D. S. Yoon, J. S. Lee, C. G. Choi and K. No, published in Japanese Journal of Applied Physics 33, (1994), pp. 2675–2678, entitled, "Effects of Substrate and Bottom Electrodes on the Phase Formation of Lead Zirconate Titanate Thin Films Prepared by the Sol–Gel Method".

Article by J. J. Lee and S. K. Dey, published in Appl. Phys. Lett. 60 (20), (May 18, 1992), pp. 2487–2488 entitled, "Processing of a Uniaxial Ferroelectric $Pb_5Ge_3O_{11}$ Thin Film at 450° C with C–Axis Orientation".

* cited by examiner

*Primary Examiner*—David Brunsman
(74) *Attorney, Agent, or Firm*—David C. Ripma; Matthew D. Rabdau; Scott C. Krieger

(57) ABSTRACT

A method of synthesizing a PGO spin-coating precursor solution includes utilizing the starting materials of lead acetate trihydrate ($Pb(OAc)_2 \cdot 3H_2O$) and germanium alkoxide ($Ge(OR)_4 (R=C_2H_5$ and $CH(CH_3)_2)$). The organic solvent is di(ethylene glycol) ethyl ether. The mixed solution of lead and di(ethylene glycol) ethyl ether is heated in an atmosphere of air at a temperature no greater than 185° C., and preferably no greater than 190° C. for a time period in a range of thirty minutes to four hours. During the heating step the color of the solution is monitored to determine when the reaction is complete and when decomposition of the desired product begins to take place. The solution is then added to germanium di(ethylene glycol) ethyl ether to make the PGO spin-coating solution. This second step also entails heating the solution to a temperature no greater than 190° C. for a time period in a range of 0.5 to 2.0 hours. The process results in a PGO precursor solution suitable for use in spin-coating.

27 Claims, 1 Drawing Sheet

METHOD OF THE SYNTHESIS AND CONTROL OF PGO SPIN-COATING PRECURSOR SOLUTIONS

FIELD OF THE INVENTION

This invention relates to integrated circuit fabrication and, more particularly, to a method of synthesizing and controlling PGO spin-coating precursor solutions.

BACKGROUND OF THE INVENTION

Lead Germanium Oxide (PGO or $Pb_5Ge_3O_{11}$) thin films have broad application in ferroelectric 1T transistor devices. The methods of preparing PGO thin films include metal organic chemical vapor deposition (MOCVD), sputtering and spin-coating. For both MOCVD and sputtering methods, the thin film deposition processes are complex, and the equipment required is prohibitively expensive. Comparatively, the spin-coating technology is relatively simple and inexpensive.

The precursors for PGO ferroelectric thin film deposition are known in the art. The lead and germanium sources typically are lead acetate trihydrate ($Pb(OAc)_2 \cdot 3H_2O$) and germanium alkoxide ($Ge(OR)_4$ (wherein $R=C_2H_5$ or $CH(CH_3)_2$)). The organic solvents are 2-methoxyethanol and di(ethylene glycol) ethyl ether (DEGEE). In the prior art synthesis route, the first step is normally the distillation of $Pb(OAc)_2 \cdot 3H_2O$ in an organic solvent and then removal of the water. After mixing with the $Ge(OR)_4$ organic solution, the PGO solution is further heated in a di(ethylene glycol) ethyl ether solution. The PGO solution is not heated in the 2-methoxyethanol composition due to solid precipitation during the distillation. During heating in the di(ethylene glycol) ethyl ether, the PGO solution gradually changes to a black color.

According to Applicant's experiments, there are several disadvantages to the reported PGO spin-coating precursor solution preparation. First, the 2-methoxyethanol PGO solution is not stable in air and is moisture sensitive. Second, in the DEGEE solution, the presence of a black color signifies decomposition of the PGO solution, which involves the reduction of $Pb^{2+}$ to $Pb^+$ ($Pb_2O$). Third, monitoring the quality of the precursor is necessary. Therefore, problems remaining in the reported synthesis route include determining the correct PGO solution heat treatment method, determining the correct PGO precursor solution monitoring method, and determining the correct PGO solution spin-on property control method.

SUMMARY OF THE INVENTION

The present invention is directed toward providing a heat treatment method, controlling the properties of the synthesized solution, and monitoring the solution so as to provide a suitable PGO spin-coating precursor solution. The method includes utilizing the starting materials of lead acetate trihydrate ($Pb(OAc)_2 \cdot 3H_2O$) and germanium alkoxide ($Ge(OR)_4$ (wherein $R=C_2H_5$ or $CH(CH_3)_2$)). The organic solvent is di(ethylene glycol) ethyl ether (DEGEE). The mixed solution of $Pb(OAc)_2 \cdot 3H_2O$ and DEGEE (the lead DEGEE solution) is heated in an atmosphere of air, not Argon, at a temperature no greater than 190° C., and preferably no greater than 185° C. for a time period in a range of thirty minutes to four hours. During the heating step the color of the solution is monitored by UV spectroscopy to determine when the reaction is complete and when decomposition of the desired reaction product begins to take place. A certain amount of DEGEE is then added into the lead DEGEE solution to adjust the solution to a desired lead concentration. To this lead DEGEE solution, a pre-mixed germanium DEGEE solution having a desired concentration is added to form a PGO precursor solution. The formed PGO precursor solution is then subjected to a second heating step of the process. This second step also entails heating the solution to a temperature no greater than 190° C. for a time period in a range of 0.5 to 2.0 hours in an air atmosphere. The process results in a PGO precursor solution, having a desired concentration, suitable for use in spin-coating processes.

Accordingly, an object of the invention is to provide a method of synthesizing PGO ferroelectric spin-coating solutions.

Another object of the invention is to provide a method of determining the correct PGO solution heat treatment method.

Still another object of the invention is to provide a method of monitoring PGO ferroelectric precursor spin-coating solutions.

A further object of the invention is to provide a method of controlling the properties of a PGO spin-coating solution.

DETAILED DESCRIPTION OF THE PREFERRED EMBODIMENTS

Figure 1:
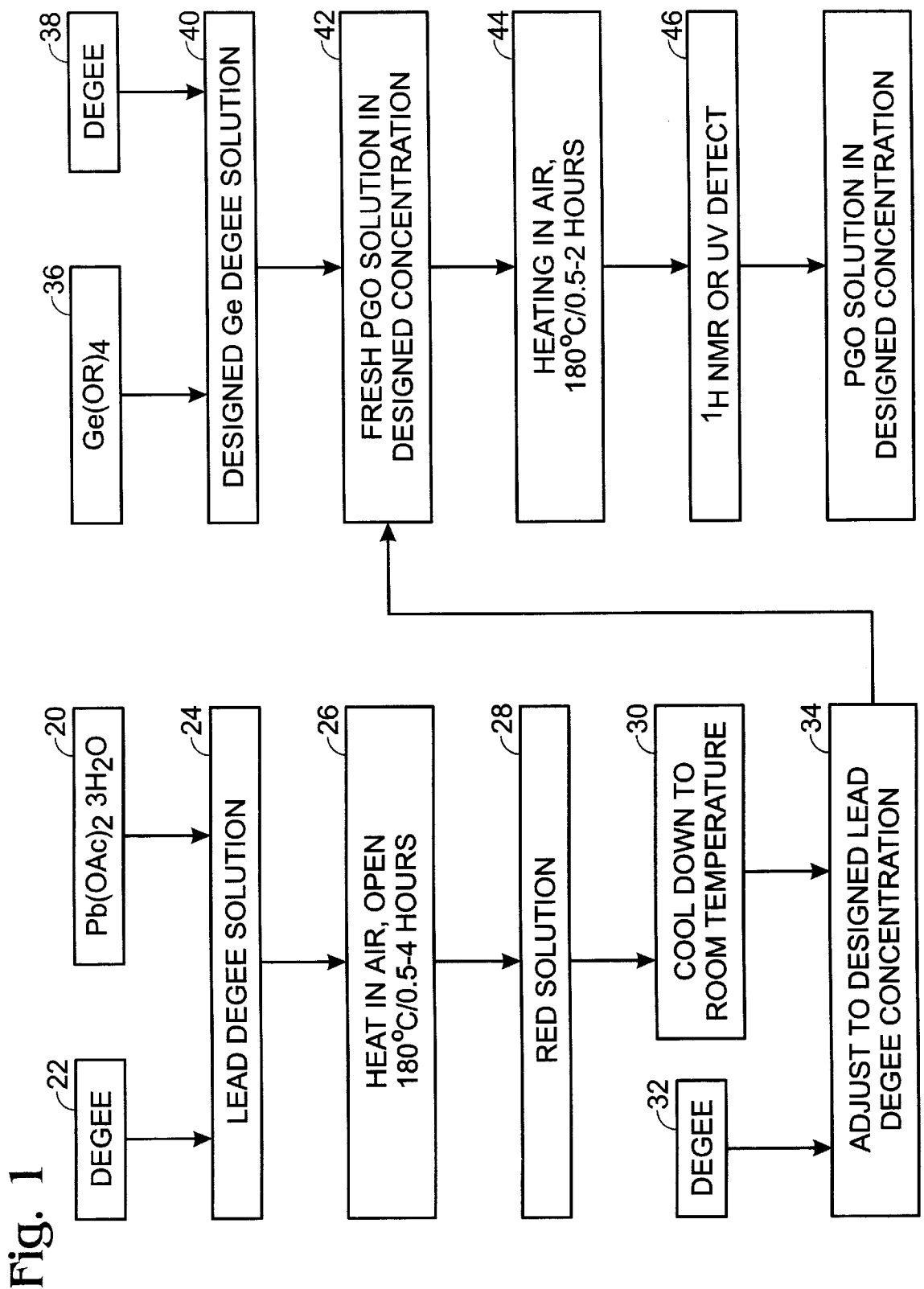
FIG. 1 is a flowchart of the process of the present invention.

The starting materials used in the synthesis of the present invention include lead acetate trihydrate ($Pb(OAc)_2 \cdot 3H_2O$) and germanium alkoxide ($Ge(OR)_4$ (wherein $R=C_2H_5$ or $CH(CH_3)_3$)). The organic solvent is di(ethylene glycol) ethyl ether (DEGEE). The first step comprises heating the $Pb(OAc)_2 \cdot 3H_2O$ in di(ethylene glycol) ethyl ether at a temperature in a range of 170 to 185° C. for a time period in a range of thirty minutes to four hours. The final lead concentration is adjusted to a designed, i.e., a desired, value by the addition of additional DEGEE after the solution is cooled down to room temperature. For example, one desired concentration of the lead DEGEE solution may be a concentration in a range of 0.4 to 0.6 Normal (0.4 to 0.6 N).

According to a FTIR analysis conducted by Applicants, the water attached to the $Pb(OAc)_2$ was not completely removed. Accordingly, the lead experienced oxidation from $Pb^{2+}$ to $Pb^{2+}$-$Pb^{3+}$ ($Pb_3O_4$) if heated in air, or the reduction from $Pb^{2+}$ to $Pb^+$ if heated in an Argon (Ar) atmosphere. Overheating will cause decomposition of the compound and results in a large amount of brown solid being precipitated. Therefore, Applicants have determined that control of the $Pb(OAc)_2 \cdot 3H_2O$ heating process is critical.

Initially, Applicants heated the $Pb(OAc)_2 \cdot 3H_2O$ and di(ethylene glycol) ethyl ether (DEGEE) in Ar, and tried to distill off the water. The results indicated that some black solid precipitated from the solution. The black solid is believed to be the $Pb_2O$ from the reduction of $Pb(OAc)_2 \cdot 3H_2O$. When the solution was exposed to air with stirring, the black solid was then dissolved, which signifies the oxidation of $Pb_2O$ to $Pb^{2+}$. The solution then became unstable, and experienced gelatation with time. Thus, Applicants concluded that the heating process in an Argon atmosphere is not acceptable for the manufacture of PGO spin-coating solutions.

Applicants turned to a heating process conducted in an open atmosphere of air. Applicants found that the color of the solution gradually changed from a dilute yellow-brown to a deep red-brown with the appropriate time and temperature. In particular, the lead DEGEE solution was heated at a temperature in a range of 170 to 190° C. for a time period in a range of thirty minutes to four hours. The highest temperature preferably is 190° C. because above this temperature of 190° C. the compound may decompose rapidly. The resulting red-brown solution, without any decomposition of the lead solution, can be used to make the desired PGO spin-coating solutions.

In the second step of the process, a $Ge(OR)_4$ DEGEE solution having a desired concentration is added into the lead DEGEE solution to make the desired PGO spin-coating precursor solution. The germanium DEGEE solution typically is manufactured by mixing $Ge(OR)_4$ (wherein $R=C_2H_5$ or $CH(CH_3)_2$) and DEGEE to achieve a desired concentration, for example, a concentration in a range of 0.4 to 0.6 N. The resulting PGO precursor solution must experience a heating treatment before use or the solution can not be spun well on a wafer surface. Incorrect spinning will result in a rough PGO film. Similar to the heating process of the lead solution, the heat treatment of the PGO mixed solution also experiences decomposition above a preferred temperature. Therefore, one must control the heating step so as to not overheat the solution, which will lead to decomposition, but at the same time one must heat the solution a sufficient amount so that the solution will meet the requirements for spin-coating. In particular, the PGO solution is subjected to a heating step at a temperature in a range of 170 to 185° C., for a time period in a range of 0.5 to 2.0 hours. The heating preferably takes place in an air atmosphere. This will result in the solution being heated until it turns a deep red color.

In particular, Applicants found in their $^1H$ NMR experiment that the decomposition of the PGO solution gave a clear peak at 3.15 ppm. Comparing this result to the results for the desired PGO precursor solutions, Applicants found that PGO thin films using good PGO solutions, i.e., non-decomposed solutions, show good hysteresis loops, while solutions using decomposed PGO solutions show poor hysteresis loops. Additionally, due to the color change of the solution, one may also use a UV spectrometer to detect the heat ending point, i.e., the preferred end point or upper temperature used in the second heating step.

The synthesis process is summarized in FIG. 1. Step 20 comprises providing lead acetate trihydrate. Step 22 comprises providing di(ethylene glycol) ethyl ether. Step 24 comprises mixing the two starting materials in a reaction vessel to form a lead di(ethylene glycol) ethyl ether solution. Step 26 comprises heating the solution in an open air atmosphere at a temperature in a range of 170 to 185° C., and preferably at a temperature of 180° C., for a time period in a range of thirty minutes to four hours. Step 28 comprises monitoring heating step 26 so as to determine when the solution is a deep red-brown color. At such a point, the heating step typically is terminated. Step 30 comprises cooling the solution down to room temperature, and preferably to a temperature of 25° C. Step 32 comprises providing di(ethylene glycol) ethyl ether. Step 34 comprises adding the di(ethylene glycol) ethyl ether of step 32 to the cooled solution of step 30. Step 34 results in a lead DEGEE solution having a desired concentration, for example, a concentration in a range of 0.4 to 0.6 Normal.

Step 36 comprises providing germanium alkoxide (Ge (OR)$_4$ (where $R=C_2H_5$ or $CH(CH_3)_3$)). Step 38 comprises providing di(ethylene glycol) ethyl ether. Step 40 comprises forming a germanium DEGEE solution in a designed concentration, for example, a concentration in a range of 0.4 to 0.6 N. Step 42 comprises adding the solution of step 40 to the lead di(ethylene glycol) ethyl ether solution of step 34 to form a PGO precursor solution. The PGO precursor solution may be considered "fresh" in that it has not been heated. The lead DEGEE and the germanium DEGEE typically are mixed in a molar ratio range of Pb:Ge of 5.0 to 5.5:3.0 to form the PGO precursor solution. Because lead has some volatility at high temperatures, a little extra lead is used in the preparation of the lead precursor. Step 44 comprises heating and monitoring the resulting PGO precursor solution until the solution is a deep red-brown color, whereupon the heating step is terminated. In particular, this typically comprises heating the solution in an air atmosphere at a temperature in a range of 170 to 185° C., and preferably at a temperature of 180° C., for a time period in a range of 0.5 to 2.0 hours. This will result in a PGO precursor solution having a desired concentration and being suitable for use in spin-coating. For example, the PGO precursor solution may have a concentration in a range of 0.4 to 0.6 Normal. Step 46 comprises conducting analytical tests to determine the composition of the resulting PGO precursor spin-coating solution, including $^1H$ NMR and/or UV detection methods. Step 46 may be conducted during heating step 44 so as to determine when the heating step should be ended, i.e., when the appropriate PGO precursor spin-coating solution has been created.

Thus, a method of synthesizing a PGO precursor spin-coating solution has been disclosed. Although preferred methods of fabricating the solution have been disclosed, it should be appreciated that further variations and modifications may be made thereto without departing from the scope of the invention as defined in the appended claims.

We claim:

1. A method of synthesizing a PGO spin-coating precursor solution comprising the steps of:
    providing lead acetate trihydrate;
    providing di(ethylene glycol) ethyl ether;
    mixing said lead acetate trihydrate and said di(ethylene glycol) ethyl ether to form a lead di(ethylene glycol) ethyl ether solution;
    heating the lead di(ethylene glycol) ethyl ether solution in an open air atmosphere at a temperature in a range of 170 to 185° C.

2. The method of claim 1 wherein said step of heating the lead di(ethylene glycol) ethyl ether solution is conducted for a time period in a range of thirty minutes to four hours.

3. The method of claim 1 further comprising monitoring said lead di(ethylene glycol) ethyl ether solution to determine when the solution is a deep red-brown color, and thereupon terminating said heating step.

4. The method of claim 1 further comprising cooling the lead di(ethylene glycol) ethyl ether solution down to a room temperature.

5. The method of claim 4 further comprising adding di(ethylene glycol) ethyl ether to the lead di(ethylene glycol) ethyl ether solution to form a lead DEGEE solution having a desired concentration.

6. The method of claim 5 wherein the desired concentration of the lead DEGEE solution comprises a concentration in a range of 0.4 to 0.6 Normal.

7. The method of claim 1 further comprising mixing germanium alkoxide $Ge(OR)_4$, wherein R is chosen from the group consisting of $C_2H_5$ and $CH(CH_3)_3$, and di(ethylene glycol) ethyl ether to form a germanium DEGEE solution having a desired concentration.

8. The method of claim 7 wherein the desired concentration of the germanium DEGEE solution comprises a concentration in a range of 0.4 to 0.6 Normal.

9. The method of claim 7 further comprising mixing said lead di(ethylene glycol) ethyl ether solution and said germanium DEGEE solution to form a precursor solution.

10. The method of claim 9 further comprising heating and monitoring said precursor solution until the precursor solution is a deep red-brown color, whereupon the step of heating said precursor solution step is terminated.

11. The method of claim 10 wherein said heating step comprises heating the precursor solution in an air atmosphere at a temperature in a range of 170 to 185° C., for a time period in a range of 0.5 to 2.0 hours, so as to provide a PGO precursor solution suitable for use in spin-coating.

12. The method of claim 11 wherein said PGO precursor solution has a concentration in a range of 0.4 to 0.6 Normal.

13. The method of claim 10 wherein said monitoring step comprises conducting analytical tests to determine the composition of the resulting precursor solution, wherein said analytical tests are chosen from the group consisting of $^1$H NMR and UV spectorscopy tests.

14. The method of claim 9 wherein said step of mixing said lead di(ethylene glycol) ethyl ether solution and said germanium DEGEE solution to form a precursor solution comprises mixing the lead di(ethylene glycol) ethyl ether and the germanium DEGEE in a Pb:Ge molar ratio range of 5.0 to 5.5:3.0.

15. The method of claim 1 wherein said step of heating the lead di(ethylene glycol) ethyl ether solution comprises heating the lead di(ethylene glycol) ethyl ether solution until it is a deep red-brown color.

16. A method of synthesizing a PGO spin-coating precursor solution comprising the steps of:

providing lead acetate trihydrate;

providing di(ethylene glycol) ethyl ether;

mixing said lead acetate trihydrate and said di(ethylene glycol) ethyl ether to form a lead di(ethylene glycol) ethyl ether solution;

heating the lead di(ethylene glycol) ethyl ether solution in an open air atmosphere until it is a deep red-brown color.

17. The method of claim 16 wherein said step of heating the lead di(ethylene glycol) ethyl ether solution comprises heating the lead di(ethylene glycol) ethyl ether solution in an open air atmosphere at a temperature in a range of 170 to 185° C. for a time period in a range of thirty minutes to four hours.

18. The method of claim 16 further comprising cooling the lead di(ethylene glycol) ethyl ether solution down to a temperature of 25° C.

19. The method of claim 16 further comprising adding di(ethylene glycol) ethyl ether to the lead di(ethylene glycol) ethyl ether solution to form a lead di(ethylene glycol) ethyl ether solution having a desired concentration.

20. The method of claim 19 wherein said desired concentration of the lead di(ethylene glycol) ethyl ether solution is in range of 0.4 to 0.6 Normal.

21. The method of claim 16 further comprising adding germanium alkoxide $Ge(OR)_4$, wherein R is chosen from the group consisting of $C_2H_5$ and $CH(CH_3)_3$, to di(ethylene glycol) ethyl ether to form a germanium di(ethylene glycol) ethyl ether solution having a desired concentration.

22. The method of claim 21 wherein said desired concentration of said germanium di(ethylene glycol) ethyl ether solution is in a range of 0.4 to 0.6 Normal.

23. The method of claim 21 further comprising adding said lead di(ethylene glycol) ethyl ether solution to said germanium di(ethylene glycol) ethyl ether solution to form a precursor solution.

24. The method of claim 23 further comprising heating and monitoring said precursor solution until the precursor solution is a deep red-brown color, whereupon the step of heating said precursor solution step is terminated.

25. The method of claim 24 wherein said heating step comprises heating the precursor solution in an air atmosphere at a temperature in a range of 170 to 185° C., for a time period in a range of 0.5 to 2.0 hours, so as to provide a PGO precursor solution suitable for use in spin-coating.

26. The method of claim 25 wherein said PGO precursor solution has a concentration in a range of 0.4 to 0.6 Normal.

27. The method of claim 24 wherein said monitoring step comprises conducting analytical tests to determine the composition of the precursor solution, wherein said analytical tests are chosen from the group consisting of $^1$H NMR and UV spectorscopy tests.

* * * * *